United States Patent
Kwon et al.

(10) Patent No.: US 7,573,774 B2
(45) Date of Patent: Aug. 11, 2009

(54) MULTI-CHIP SEMICONDUCTOR MEMORY DEVICE HAVING INTERNAL POWER SUPPLY VOLTAGE GENERATION CIRCUIT FOR DECREASING CURRENT CONSUMPTION

(75) Inventors: Oh Suk Kwon, Yongin-si (KR); Dae Seok Byeon, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 293 days.

(21) Appl. No.: 11/542,105

(22) Filed: Oct. 4, 2006

(65) Prior Publication Data

US 2007/0081408 A1 Apr. 12, 2007

(30) Foreign Application Priority Data

Oct. 6, 2005  (KR) ..................... 10-2005-0093662

(51) Int. Cl.
   *G11C 5/14* (2006.01)
(52) U.S. Cl. ............... 365/226; 365/189.2; 365/210.12; 365/230.05; 365/230.12
(58) Field of Classification Search ................. 365/226, 365/189.2, 210.12, 230.05, 233.12, 233.15, 365/230.12
   See application file for complete search history.

(56) References Cited

U.S. PATENT DOCUMENTS

| 5,862,096 | A | 1/1999 | Yasuda et al. | |
| 6,195,306 | B1 | 2/2001 | Horiguchi et al. | |
| 6,496,438 | B2* | 12/2002 | Saito | 365/226 |
| 7,158,423 | B2* | 1/2007 | Seo | 365/189.09 |
| 2004/0155636 | A1* | 8/2004 | Fukui et al. | 323/281 |
| 2008/0002490 | A1* | 1/2008 | Kim | 365/201 |

FOREIGN PATENT DOCUMENTS

| JP | 2004140503 | 5/2004 |
| KR | 1998-063362 | 10/1998 |
| KR | 1999-0083120 | 11/1999 |
| KR | 100353544 B1 | 9/2002 |
| KR | 1020040008333 A | 1/2004 |

* cited by examiner

*Primary Examiner*—Pho M. Luu
(74) *Attorney, Agent, or Firm*—Volentine & Whitt, PLLC (57) ABSTRACT

A multi-chip semiconductor memory device includes of a plurality of memory chips sharing a predetermined chip enable signal. Each of the plurality of memory chips includes an active internal power supply generation circuit configured to convert an external power supply voltage into an internal power supply voltage and to be disabled in response to deactivation of a predetermined drive control signal. Each of the plurality of memory chips also includes a conversion control circuit for generating the drive control signal, wherein the drive control signal is deactivated in an interval in which any of the plurality of memory chips is in an active interval.

14 Claims, 8 Drawing Sheets

MULTI-CHIP SEMICONDUCTOR MEMORY DEVICE HAVING INTERNAL POWER SUPPLY VOLTAGE GENERATION CIRCUIT FOR DECREASING CURRENT CONSUMPTION

BACKGROUND OF THE INVENTION

1. Field of the Invention

The present invention relates generally to a multi-chip semiconductor memory device having a plurality of memory chips, and more particularly, to a multi-chip semiconductor memory device having a plurality of memory chips, each including internal power supply voltage generation circuits which independently convert an external power supply voltage into an internal power supply voltage.

2. Description of the Related Art

A memory chip includes an internal power supply voltage generation circuit which may generate a low-level internal power supply voltage by converting an external power supply voltage into the internal power supply voltage. Power consumption of the memory chip may be decreased by using such an internal power supply voltage generation circuit. Furthermore, even though the external power supply voltage may change, the internal power supply voltage may be kept relatively uniform, so that the memory chip can maintain a uniform operation voltage. Generally, a single memory chip may include a standby internal power supply voltage generation circuit and an active internal power supply voltage circuit. The standby internal power supply generation circuit may have a small capacity and may be driven by an external power supply voltage. On the other hand, the active internal power supply voltage generation circuit may have a large capacity and may be enabled at the time of activation.

New electronic devices are becoming smaller and lighter due to developments in semiconductor fabrication technology and user demand. These developments have lead to the manufacturing of a multi-chip semiconductor memory device in which a plurality of memory chips are mounted in a single package.

Figure 1:
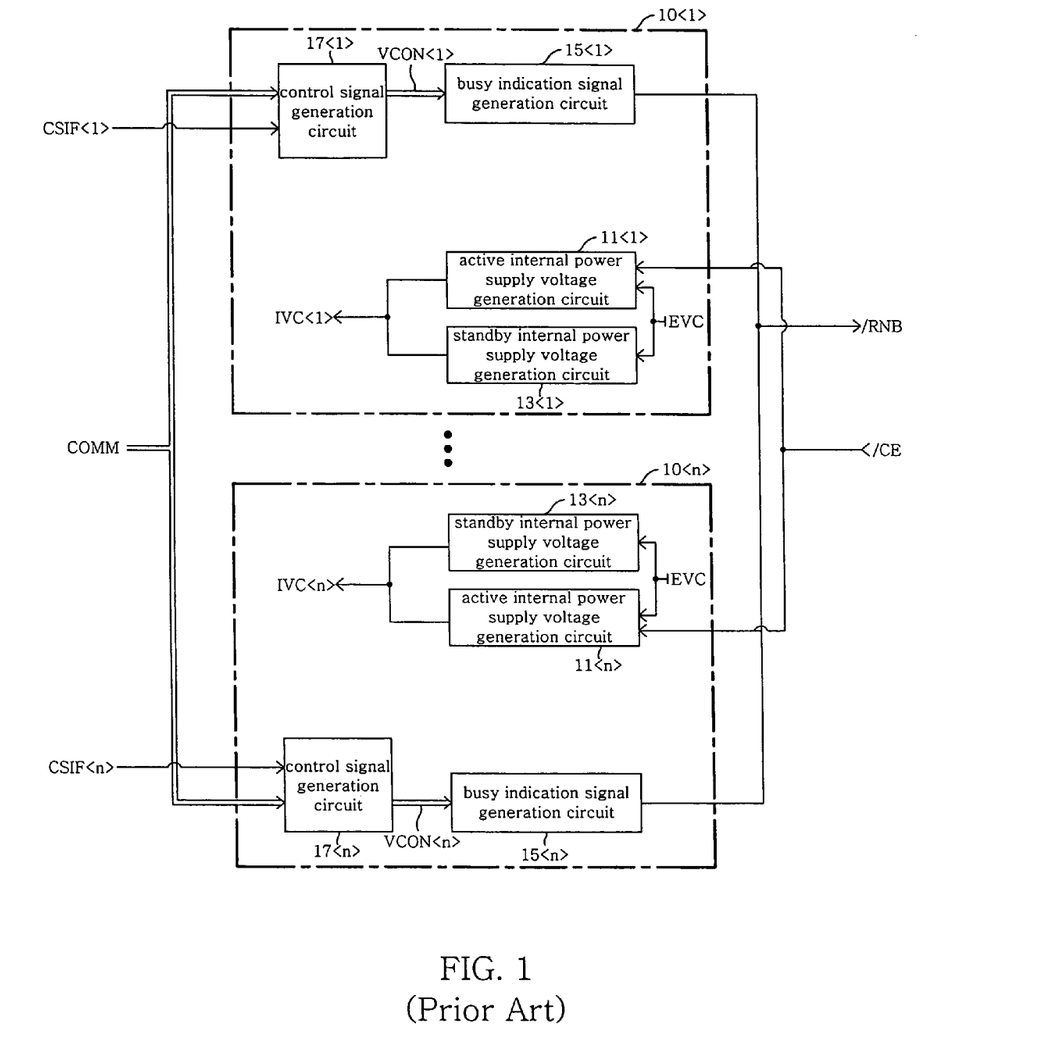
FIG. 1 is a diagram illustrating a conventional multi-chip semiconductor memory device.

FIG. 1 is a diagram illustrating a conventional multi-chip semiconductor memory device. As illustrated in FIG. 1, a plurality of memory chips 10<1:n> are mounted in the multi-chip semiconductor memory device. Furthermore, the plurality of memory chips 10 share a chip enable signal /CE. Each of the plurality of memory chips includes an active internal power supply voltage generation circuit 11 and a standby internal power supply voltage generation circuit 13. The busy indication signal generation circuit 15 of each memory chip 10 generates a busy indication signal RNB, which is shared by the memory chips 10. Furthermore, the control signal generation circuit 17 of each memory chip 10 generates an operation control signal which controls its busy indication generation circuit 15 in response to an external command COMM and chip selection information CSIF.

Figure 2:
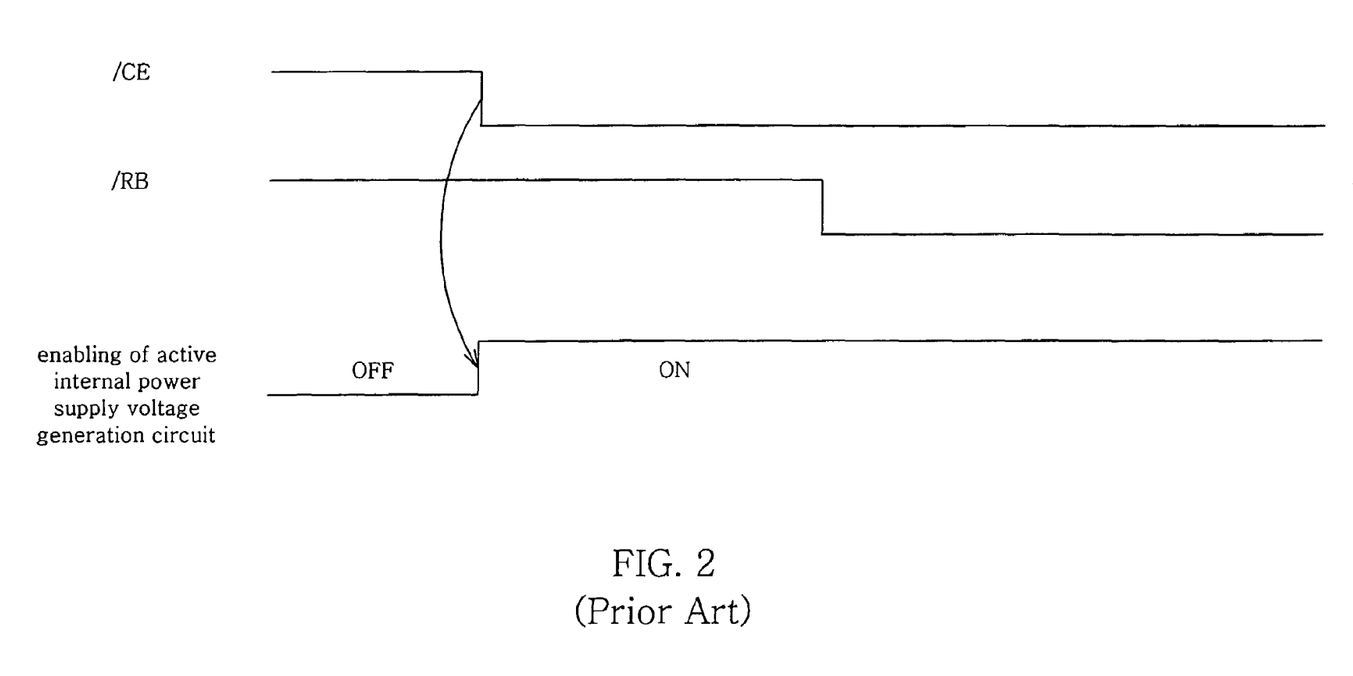
FIG. 2 is a diagram illustrating an enabled interval of the active internal power supply voltage generation circuits in the multi-chip semiconductor memory device of FIG. 1.

While the conventional multi-chip semiconductor memory device includes a plurality of memory chips, it has several limitations. For example, as illustrated in FIG. 2, the chip enable signal /CE controls the enabling of all the active internal power supply voltage generation circuits 11. Therefore, although only one memory chip 10 may be in an active interval, the active internal power supply voltage generation circuits 11 of the inactive memory chips 10 are also enabled. The enabling of all the active internal power supply generation circuits 11 despite not all the memory chips being in an active interval may cause unnecessary power consumption in the active internal power supply voltage generation circuits.

The present disclosure is directed to overcoming one or more of the problems associated with the conventional multi-chip semiconductor memory devices.

SUMMARY OF THE INVENTION

One aspect of the present disclosure includes a muti-chip semiconductor memory device comprising a plurality of memory chips sharing a predetermined chip enable signal. Each of the plurality of memory chips may comprise of an active internal power supply generation circuit configured to convert an external power supply voltage into an internal power supply voltage and to be disabled in response to deactivation of a predetermined drive control signal. Each of the plurality of memory chips may also comprise of a conversion control circuit for generating the drive control signal, wherein the drive control signal is deactivated in an interval in which any of the plurality of memory chips is in an active interval.

Another aspect of the present disclosure includes a muti-chip semiconductor memory device. The muti-chip semiconductor memory device may include a plurality of memory chips sharing a predetermined chip enable signal. Furthermore, each of the plurality of memory chips may include an active internal power supply generation circuit which independently converts an external power supply voltage into an internal power supply voltage wherein, while any of the plurality of memory chips is in an active interval, active internal power supply generation circuits of remaining memory chips are disabled

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE EXEMPLARY EMBODIMENTS

Reference should now be made to the drawings, in which the same reference numerals are used throughout the different drawings to designate the same or similar components.

In the present specification, a memory cell may perform a program or erase operation using the data of the data line of a corresponding memory chip, or may perform a read operation, in which the data of a memory cell is read to a data line during a 'busy interval.' Furthermore, a 'command input operation' in which a command is received from a corresponding memory chip, may be performed during a 'command input interval.'

In the present specification, the 'busy operation' and the 'command input operation' may be referred to in common as an "active operabon", and the 'busy interval' and the 'command input interval' may be referred to in common as an "active interval."

In the present specification, embodiments in which a plurality of memory chips are implemented using "nonvolatile memory" are described. However, the present invention is not limited to the embodiments, and can be applied to other types of memory such as, for example, DRAM.

The preferred embodiments of the present invention are described in detail with reference to the accompanying drawings.

In each drawing, if there is a need to distinguish between like components, characters < > are added after the reference numerals, and distinguishing numerals are included within the characters < >.

Figure 3:
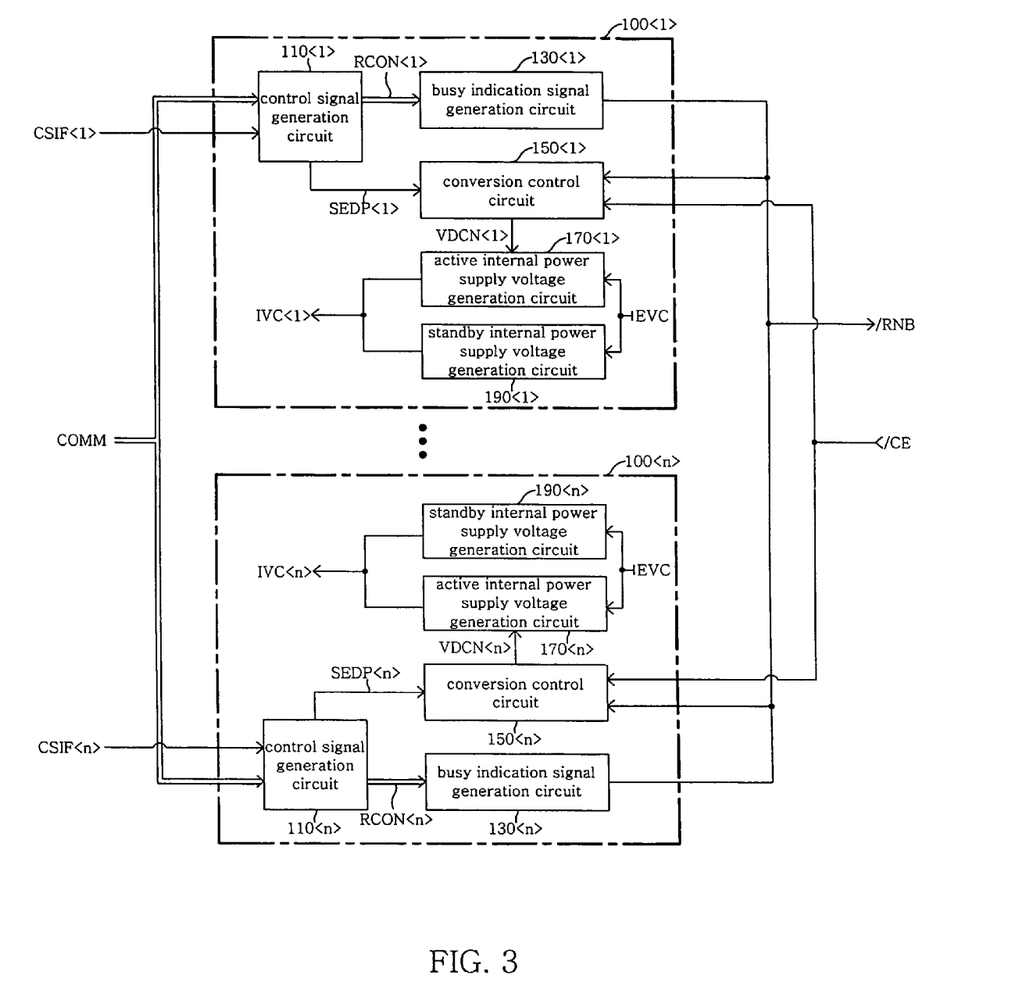
FIG. 3 is a block diagram illustrating a muti-chip semiconductor memory device according to an exemplary disclosed embodiment.

FIG. 3 is a block diagram illustrating a multi-chip semiconductor memory device according to an exemplary disclosed embodiment. Referring to FIG. 3, the multi-chip semiconductor memory device of an exemplary embodiment includes a plurality of memory chips 100. In the disclosed embodiment, the memory chips may be nonvolatile memory.

The memory chips 100 may share a chip enable signal /CE. Specifically, the plurality of memory chips are enabled when the chip enable signal /CE is activated to "L". In addition, the plurality of memory chips share an external command COMM that selectively performs an active operation in response to a corresponding chip selection signal.

Each of the memory chips generates a busy indication signal /RNB, which is activated to "L" when the memory chip is in its active interval. In an exemplary embodiment, the busy indication signal /RNB is commonly connected to the plurality of memory chips 100. Therefore, when any one of the memory chips 100 performs a busy operation, the busy indication signal is activated to "L".

Referring to FIG. 3, each of the memory chips 100 includes a control signal generation circuit 110, a busy signal generation circuit 130, a conversion control circuit 150, an active internal power supply voltage generation circuit 170, and a standby internal power supply voltage generation circuit 190.

The control signal generation circuit 110 of each memory chip 100 generates its own selection indication signal SEDP and a group of busy control signals RCON in response to the external command COMM and corresponding chip selection information CSIF. The group of busy control signals RCON is applied to the busy indication generation circuit 130. The selection indication signal SEDP is activated to "H" during the active interval when the corresponding memory chip 100 is selected. As mentioned above, the busy signal generation circuit 130 included in each memory chip 100 generates the busy indication signal /RNB in common.

The conversion control circuit 150 of each memory chip 100 receives both, the chip enable signal /CE and the busy indication signal /RNB in common. Furthermore, the conversion control circuit 150 receives its own selection indication signal SEDP and generates its own drive control signal VDCN.

Figure 4:
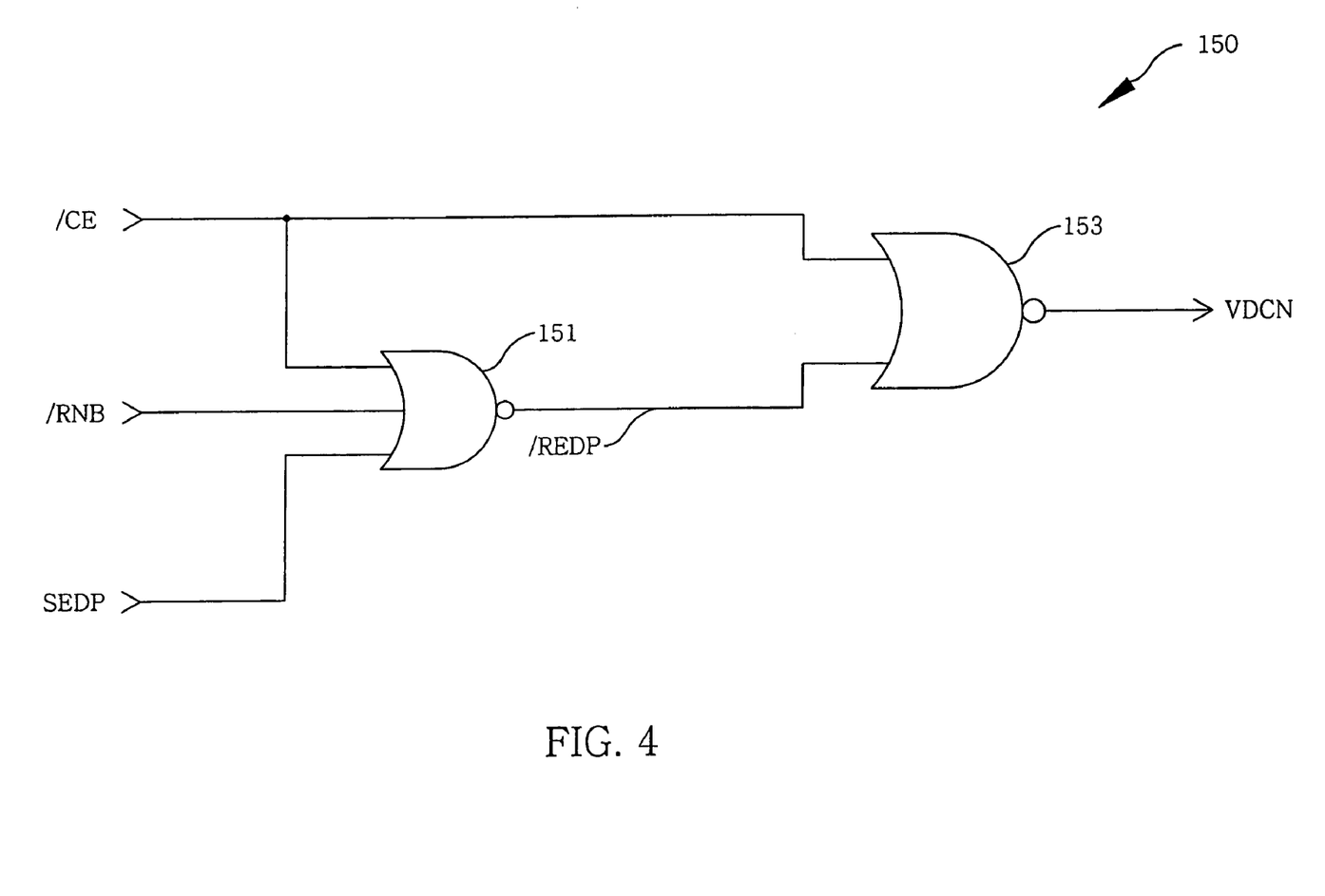
FIG. 4 is a diagram illustrating a conversion control circuit according to an exemplary disclosed embodiment.

FIG. 4 is a diagram illustrating the conversion control circuit 150 of FIG. 3 in detail according to an exemplary disclosed embodiment. Referring to FIG. 4, the conversion control circuit 150 includes a first logic circuit 151 and a second logic circuit 153. As show in FIG. 4, the first and second logic circuits 151 and 153 may be NOR gates.

The first logic circuit 151 may generate an indication response signal /REDP by performing a logical sum operation on the chip enable signal /CE, the busy indication signal /RNB, and the selection indication signal SEDP, that are input to the first logic circuit 151, and inverting a resulting signal. Therefore, when the selection indication signal SEDP, which includes information about whether a corresponding memory chip has been selected, is deactivated to the "L" state, and when the chip enable signal /CE and the busy indication signal /RNB have also been deactivated to "L", the indication response signal /REDP is deactivated to the "H" state.

The second logic circuit 153 outputs the drive control signal VDCN by performing a logical sum operation on the chip enable signal /CE and the indication response signal, and inverting a resulting signal. Therefore, when the chip enable signal /CE is in a deactivated "H" state, or the indication response signal /SEDP1 enters a deactivated state of "H", the drive control signal VDCN is disabled to "L".

The logical states of the drive control signal VDCN are summarized below.

Figure 5:
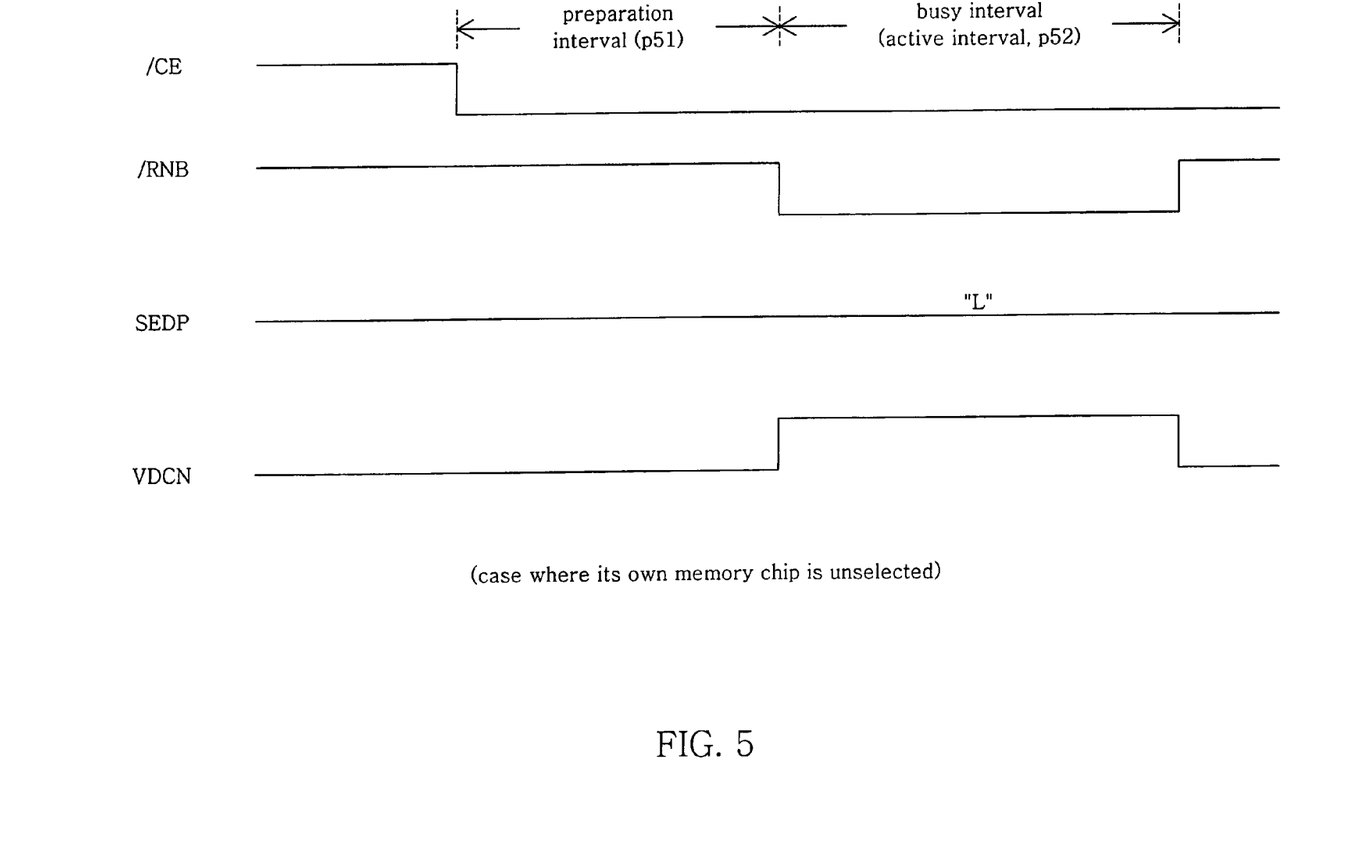
FIG. 5 is a diagram illustrating the timing of respective signals in the conversion control circuit of FIG. 4 when a corresponding memory chip is not selected according to an exemplary disclosed embodiment.

First, in the case where a specific memory chip is not selected, a corresponding drive control signal VDCN has the logical states illustrated in FIG. 5. At this time, the selection indication signal SEDP continuously maintains an "L" state.

In a preparation interval p51, the chip enable signal /CE is enabled to "L", but the busy indication signal /RNB maintains an "H" state. At this time, the drive control signal VDCN is activated to "H". That is, in an interval in which the memory chips are all in an enabled state, but do not yet perform an active operation, the drive control signal is activated to "H".

Furthermore, in a busy interval p52 (corresponding to an active interval in the present specification), the chip enable signal /CE and the busy indication signal /RNB are activated to "L". At this time, the drive control signal is deactivated to "L". That is, when any of the other memory chips 100 performs an active operation, the drive control signal of the unselected memory chip 100 is deactivated to "L".

Figure 6:
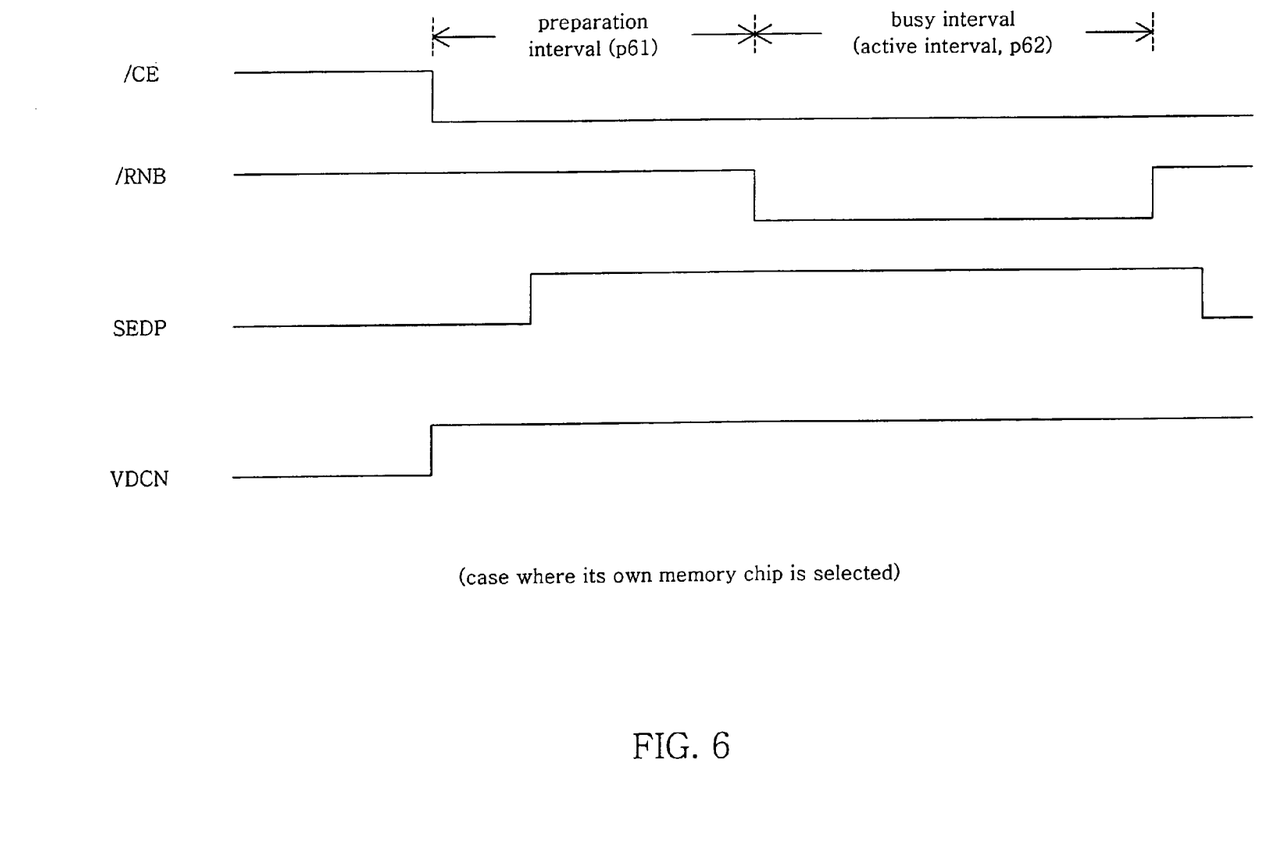
FIG. 6 is a diagram illustrating the timing of respective signals in the conversion control circuit of FIG. 4 when a corresponding memory chip is selected according to an exemplary disclosed embodiment.

Next, when its own memory chip 100 is selected, the corresponding drive control signal VDCN has the logical states illustrated in FIG. 6. At this time, the selection indication signal SEDP maintains an "H" state in an interval including the interval in which the busy indication signal /RNB is activated to "L". In this case, during the preparation interval p61 and a busy interval p62, the drive control signal VDCN maintains an "H" state.

As a result, in the case where its own memory chip is selected, the drive control signal VDCN is activated to "H" in the interval in which the busy indication signal /RNB is activated to "L". In contrast, in the case where its own memory chip is not selected, the drive control signal VDCN is deactivated to "L" in the interval in which the busy indication signal /RNB is activated to "L".

Referring to FIG. 3 again, the active internal power supply voltage generation circuit 170 may convert an external power supply voltage EVC into an internal power supply voltage IVC. In an exemplary embodiment, the active internal power supply voltage generation circuit 170 may be controlled by its own drive control signal VDCN. That is, the active internal power supply voltage generation circuit 170 may be disabled when the corresponding drive control signal VDCN is in a deactivated "L" state.

Figure 7:
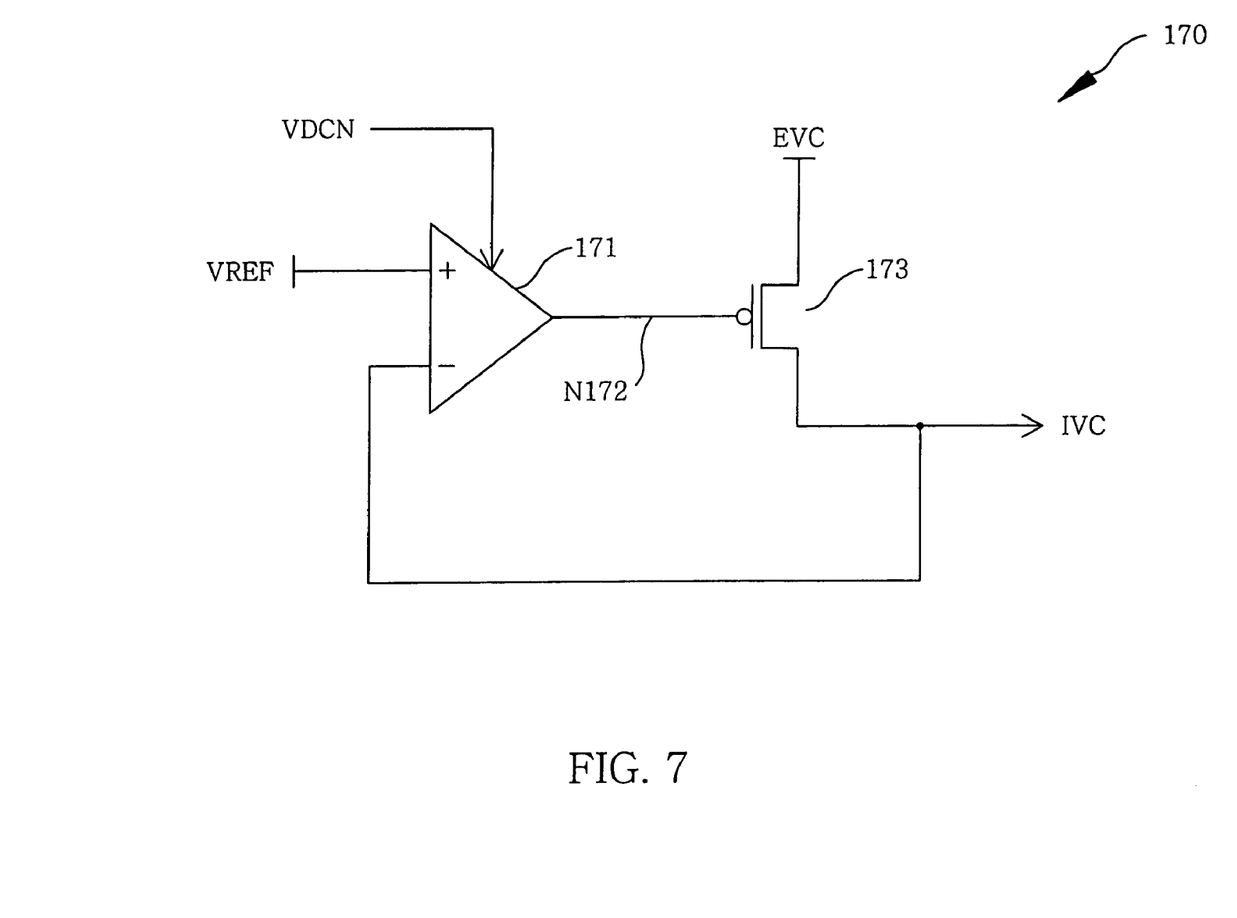
FIG. 7 is a diagram illustrating the active internal power supply voltage generation circuit of FIG. 3 according to an exemplary disclosed embodiment.

FIG. 7 is a diagram illustrating the active internal power supply voltage generation circuit 170 of FIG. 3 according to an exemplary disclosed embodiment. Referring to FIG. 7, the active internal power supply voltage generation circuit 170 includes a comparator 171 and a PMOS transistor 173.

The comparator 171 is enabled when the drive control signal VDCN is in an "H" state. At this time, the comparator 171 compares the internal power supply voltage IVC with a predetermined reference voltage VREF. The PMOS transistor 173 is gated by the output signal of the comparator 171 and supplies current across the external power supply voltage EVC and the internal power supply voltage IVC. Thus, the external power supply voltage EVC is converted into the internal power supply voltage, which is controlled by the active internal power supply voltage generation circuit 170 such that it has the same level as the predetermined voltage VREF.

In an exemplary embodiment, when the drive control signal VDCN is in an "L" state, the comparator 171 is disabled. At this time, the output signal N172 of the comparator 171 enters an "H" state, so that the PMOS transistor 173 is turned off. Therefore, the active internal power supply voltage generation circuit 170 is disabled, and the internal power supply voltage is not controlled.

Thus, the active internal power supply voltage generation circuit formed in each memory chip of the multi-chip semiconductor device is disabled while some other memory chip is selected and performs its active operation.

For example, while a memory chip 100<1> performs the active operation, the drive control signal VDCN<1> of the memory chip 100<1> is activated to "H", and the active internal power supply voltage generation circuit 170<1> of the memory chip 100<1> is enabled. However, the drive control signals VDCN<2> to VDCN<n> of the remaining memory chips 100<2> to 100<n> are deactivated to "L" and the active internal power supply voltage generation circuits 170<2> to 170<n> thereof are disabled.

Therefore, power consumption in the multi-chip semiconductor memory device of the exemplary embodiment may be lower than that of the prior art multi-chip semiconductor memory device in which all of the active internal power supply voltage generation circuits embedded in memory chips are enabled.

Referring to FIG. 3 again, the standby internal power supply voltage generation circuit 190 converts an external power supply voltage EVC into an internal power supply voltage IVC. Specifically, the standby internal power supply voltage generation circuit 190 is enabled when the external power supply voltage EVC is provided to the standby internal power supply voltage generation circuit 190.

The standby internal power supply voltage generation circuit 190 may generate an internal power supply voltage IVC that is less than that of the active internal power supply voltage generation circuit 170. Furthermore, the active internal power supply voltage generation circuit 170 may consume more power at the time of being driven than the standby internal power supply voltage generation circuit 190.

Figure 8:
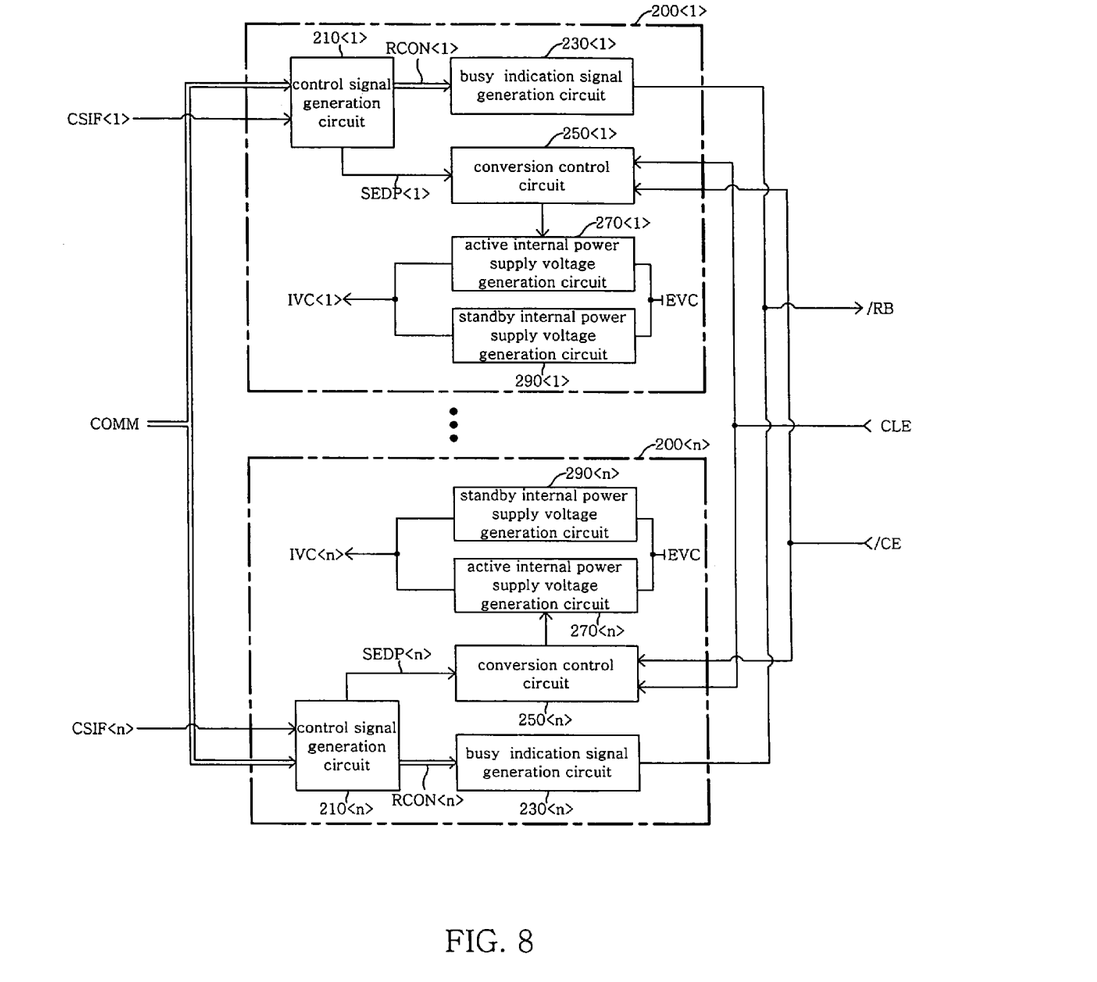
FIG. 8 is a diagram illustrating a muti-chip semiconductor memory device according to an alternative exemplary disclosed embodiment.

FIG. 8 is a diagram illustrating a multi-chip semiconductor memory device according to an alternative exemplary embodiment. The multi-chip semiconductor memory device of FIG. 8 is similar to that of FIG. 3 However, there are certain differences between the two multi-chip semiconductor memory devices of FIGS. 2 and 3. For example, the conversion control circuit 150 of FIG. 3 receives a busy indication signal /RNB in common and is controlled by the busy indication signal /RNB. In contrast, the conversion control circuit 150 of FIG. 8 receives a command latch enable signal CLE in common and is controlled by the command latch enable signal CLE.

In the device of FIG. 8, the command latch enable signal CLE is activated to "H" during a command input interval. The command input interval is the period during which a selected memory chip receives a command. Furthermore, during the command input interval in which a selected memory chip 200 receives a command, the active internal power supply voltage generation circuits 270 of the non-selected memory chips 200 are disabled. Therefore, power consumption may be lower in the command input interval of the disclosed multi-chip semiconductor memory device compared to that of the prior art multi-chip semiconductor memory device in which the active internal power supply voltage generation circuits of all memory chips are enabled.

Thus, the active internal power supply voltage generation circuit formed in each memory chip of the disclosed multi-chip semiconductor device is disabled while some other memory chip is selected and performs an active operation, leading to lower power consumption in the multi-chip semiconductor device.

For example, in the disclosed embodiments, the selection indication signal is selectively activated in the state in which the chip enable signal is activated. However, one skilled in the art will appreciate that the selection indication signal could be implemented using internal chip selection information that may be controlled based on chip selection information provided from an external source.

What is claimed is:

1. A multi-chip semiconductor memory device, comprising a plurality of memory chips sharing a predetermined chip enable signal, each of the plurality of memory chips comprising:
    an active internal power supply generation circuit configured to convert an external power supply voltage into an internal power supply voltage and to be disabled in response to deactivation of a predetermined drive control signal; and
    a conversion control circuit for generating the drive control signal, wherein the drive control signal is deactivated in an interval in which any of the plurality of memory chips is in an active interval.

2. The multi-chip semiconductor memory device as set forth in claim 1, wherein the active interval is a busy interval in which a corresponding memory chip performs any of program, erase and read operations.

3. The multi-chip semiconductor memory device as set forth in claim 2, wherein the conversion control circuit is driven to disable the drive control signal in response to deactivation of the chip enable signal.

4. The multi-chip semiconductor memory device as set forth in claim 3, wherein the plurality of memory chips share a busy indication signal, which is activated during the busy interval, and the conversion control circuit comprises:
    a first logical circuit which generates a predetermined indication response signal, which is deactivated in response to a selection indication signal including information about whether a corresponding memory chip has been selected, while the chip enable signal and the busy indication signal are activated; and
    a second logical circuit which generates the drive control signal, the drive control signal being disabled when the chip enable signal or the indication response signal is in a deactivated state.

5. The multi-chip semiconductor memory device as set forth in claim 1, wherein the active interval is a command input interval in which a corresponding memory chip receives a command.

6. The multi-chip semiconductor memory device as set forth in claim 5, wherein the conversion control circuit is driven to disable the drive control signal in response to deactivation of the chip enable signal.

7. The multi-chip semiconductor memory device as set forth in claim 5, wherein the plurality of memory chips share a busy indication signal, which is activated during the busy interval, and the conversion control circuit comprises:

- a first logical circuit which generates a predetermined indication response signal, which is deactivated in response to a selection indication signal including information about whether a corresponding memory chip has been selected, while the chip enable signal and the busy indication signal are activated; and
- a second circuit which generates the drive control signal, the drive signal being disabled when the chip enable signal or the indication response signal is in deactivated state.

8. The multi-chip semiconductor memory device as set forth in claim 1, wherein each of the plurality of memory chips further comprises a standby internal power supply voltage generation circuit which converts the external power supply voltage into the internal power supply voltage in a standby mode.

9. A multi-chip semiconductor memory device, comprising a plurality of memory chips sharing a predetermined chip enable signal and each having an active internal power supply generation circuit which independently converts an external power supply voltage into an internal power supply voltage, wherein, while any of the plurality of memory chips is in an active interval, active internal power supply generation circuits of remaining memory chips are disabled.

10. The multi-chip semiconductor memory device as set forth in claim 9, wherein the active interval is a busy interval in which the corresponding memory chip performs any of program, erase, and read operations.

11. The multi-chip semiconductor memory device as set forth in claim 10, wherein the active internal power supply generation circuit of each of the plurality of memory chips is disabled in response to deactivation of the chip enable signal.

12. The multi-chip semiconductor memory device as set forth in claim 11, wherein the active interval is a command input interval in which a corresponding memory chip receives a command.

13. The multi-chip semiconductor memory device as set forth in claim 12, wherein the active internal power supply generation circuit of each of the plurality of memory chips is disabled in response to deactivation of the chip enable signal.

14. The multi-chip semiconductor memory device as set forth in claim 11, wherein each of the plurality of memory chips further comprises a standby internal power supply voltage generation circuit which converts the external power supply voltage into the internal power supply voltage in a standby mode.

* * * * *